(12) United States Patent
Yanagihara

(10) Patent No.: US 8,530,935 B2
(45) Date of Patent: Sep. 10, 2013

(54) SEMICONDUCTOR DEVICE WITH BUFFER LAYER FOR MITIGATING STRESS EXERTED ON COMPOUND SEMICONDUCTOR LAYER

(75) Inventor: Masataka Yanagihara, Niiza (JP)

(73) Assignee: Sanken Electric Co., Ltd., Niiza-shi (JP)

( * ) Notice: Subject to any disclaimer, the term of this patent is extended or adjusted under 35 U.S.C. 154(b) by 0 days.

(21) Appl. No.: 13/445,243

(22) Filed: Apr. 12, 2012

(65) Prior Publication Data

US 2012/0261716 A1 Oct. 18, 2012

(30) Foreign Application Priority Data

Apr. 15, 2011 (JP) ................. 2011-091213

(51) Int. Cl.
*H01L 29/12* (2006.01)
*H01L 29/201* (2006.01)
(52) U.S. Cl.
USPC ........................................ 257/190

(58) Field of Classification Search
CPC ..... H01L 21/338; H01L 29/12; H01L 21/205; H01L 29/201; H01L 29/778; H01L 29/812; H01L 33/32
See application file for complete search history.

(56) References Cited

U.S. PATENT DOCUMENTS 7,652,282 B2   1/2010 Yanagihara
2011/0048514 A1* 3/2011 Norman et al. ............. 136/255

* cited by examiner

*Primary Examiner* — Walter H Swanson
(74) *Attorney, Agent, or Firm* — Oblon, Spivak, McClelland, Maier & Neustadt, L.L.P.

(57) ABSTRACT

A semiconductor device includes a substrate, a buffer layer, and a compound semiconductor layer. The buffer layer is configured by laminating two or more pairs of a first buffer and a second buffer. The first buffer is formed by laminating one or more pairs of an AlN layer and a GaN layer. The second buffer is formed of a GaN layer. A total Al composition of a pair of the first buffer and the second buffer on the compound semiconductor layer side is higher than that of a pair of the first buffer and the second buffer on the substrate side.

7 Claims, 6 Drawing Sheets

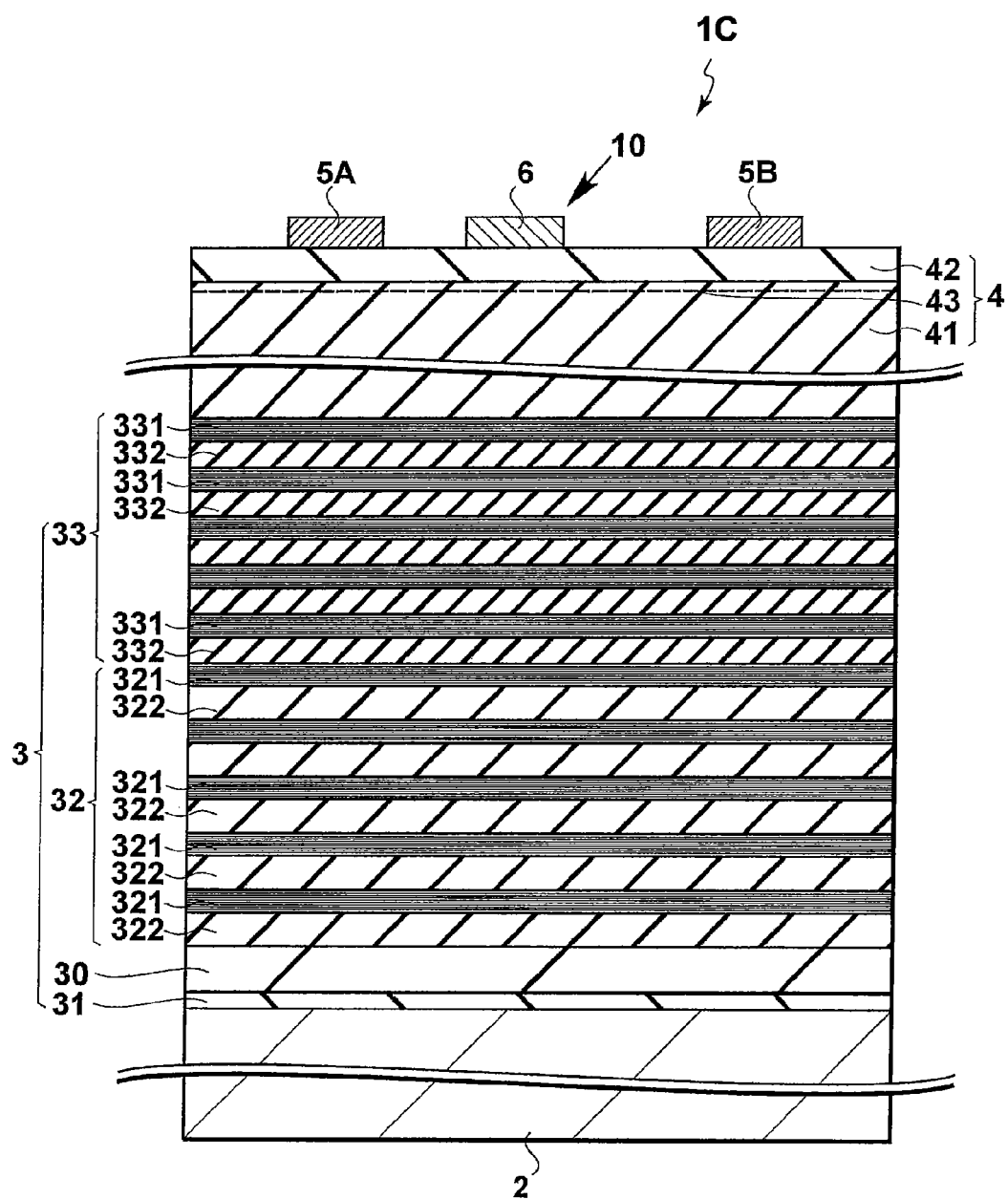

SEMICONDUCTOR DEVICE WITH BUFFER LAYER FOR MITIGATING STRESS EXERTED ON COMPOUND SEMICONDUCTOR LAYER

CROSS REFERENCE TO RELATED APPLICATION

This application claims priority to Japanese Patent Application No. 2011-091213, filed Apr. 15, 2011.

BACKGROUND OF THE INVENTION

1. Field of the Invention

This invention relates to a semiconductor device, specifically to the one in which a compound semiconductor layer is arranged on a substrate with a buffer layer interposed therebetween.

2. Description of the Related Art

Semiconductor light emitting devices and switching devices using Gallium Nitride (GaN) based compound semiconductor are generally known. Well-known semiconductor light emitting devices are a light emitting diode (LED), a semiconductor laser, and the like. Moreover, well-known switching devices are a high electron mobility transistor (HEMT), Schottky barrier diode (SBD), and the like.

Patent document 1 (U.S. Pat. No. 7,652,282 B2) discloses a semiconductor device including a main semiconductor region for HEMT formed of nitride compound semiconductor provided on a silicon substrate with a buffer formed of a nitride compound semiconductor interposed therebetween. The buffer layer includes a first multilayered buffer subregion formed on the silicon substrate and a second multilayered buffer subregion formed on the first multilayered buffer subregion. The first multilayered buffer subregion is formed by alternately laminating a multilayered buffer region (superlattice buffer region or sub multi-sublayered buffer region) of alternately laminating Al(Ga)N layers and (Al)GaN layers, and a non-sublayered buffer region of (Al)GaN layer. Similarly, the second multilayered buffer subregion is formed by alternately laminating a multilayered buffer region (superlattice buffer region or sub multi-sublayered buffer region) of alternately laminating Al(Ga)N layers and (Al)GaN layers, and a non-sublayered buffer region of (Al)GaN layer.

Thus configured semiconductor device in the patent document 1 can promote cancelling out stress generated in the first multilayered buffer subregion and stress generated in the second multilayered buffer subregion, thereby suppressing a warp of the silicon wafer. Furthermore, by suppressing the warp of the silicon wafer, the buffer layer and the main semiconductor region can be provided with greater thickness, thereby improving withstand voltage of the device in thickness direction.

SUMMARY OF THE INVENTION

However, in the semiconductor device of the patent document 1, it has been difficult to improve the withstand voltage of the device in the thickness direction of the silicon substrate by increasing a number of sets (pairs) of the superlattice buffer regions and non-sublayered buffer regions to increase thickness of the buffer layer and the main substrate region.

The present invention has been made to solve the above problem. The object of the present invention is to provide a semiconductor device in which the buffer layer and compound semiconductor (device region or main semiconductor region) can be provided with greater thickness while suppressing the warp of the substrate, thereby improving the withstand voltage of the device.

In order to solve the above problem, a semiconductor device according to the first aspect of the present invention includes a substrate; a buffer layer arranged on the substrate; and a compound semiconductor layer arranged on the buffer layer and functions as a device region. The buffer layer is configured by laminating two or more pairs of a first buffer and a second buffer. The first buffer is formed by laminating one or more pairs of a first nitride compound semiconductor layer and a second nitride compound semiconductor layer, the first nitride compound semiconductor layer having an aluminum composition therein, the second nitride compound semiconductor layer having a larger lattice constant than that of the first nitride compound semiconductor layer. The second buffer includes a third nitride compound semiconductor layer having a larger lattice constant than that of the first buffer. A total Al composition of a pair of the first buffer and the second buffer on the compound semiconductor layer side is higher than that of a pair of the first buffer and the second buffer on the substrate side.

A thickness of the second buffer on the compound semiconductor layer side may be set to be thinner than that of the second buffer on the substrate side.

In the above case, a thickness of each second buffer may be set to become gradually thinner from the substrate side towards the compound semiconductor layer side.

In each of the pairs of the first buffer and the second buffer, the second buffer may be set to be thicker than the first buffer.

Each first buffer may be set to 50 to 150 nm thickness, and each second buffer may be set to 100 to 400 nm thickness.

A total Al composition of each pair of the first buffer and the second buffer may be set to become gradually higher from the substrate side towards the compound semiconductor layer side.

For the substrate, any one of a silicon substrate, a silicon compound substrate, and a nitride compound semiconductor substrate may be used.

In accordance with the semiconductor device according to the first aspect of the present invention, the withstand voltage can be improved by providing the buffer layer and the compound semiconductor with greater thickness while suppressing the warp of the substrate.

BRIEF DESCRIPTION OF THE DRAWINGS

FIG. 5 is a schematic cross-sectional view illustrating a configuration of a main section of a semiconductor device according to Modification 3 of Embodiment 1.

DETAILED DESCRIPTION OF THE EMBODIMENTS

Embodiments of the present invention are described with reference to the drawings. In the following drawings, the same or similar components are denoted by the same or similar symbols. However, the drawings are only schematic and are different from the actual one. Further, the drawings may include parts where dimensional relations and proportion between the drawings are different from each other.

The following embodiments only exemplify devices and methods to specify technical ideas of the present invention and the technical ideas of the present invention do not limit the arrangements and so on of respective components as described below.

The technical ideas of the present invention can be changed in various ways within a scope of claims.

(Embodiment 1)

Embodiment 1 describes an example of applying the present invention in a semiconductor device provided with a high electron mobility transistor (HEMT).

[Configuration of HEMT in the Semiconductor Device]

Figure 1:
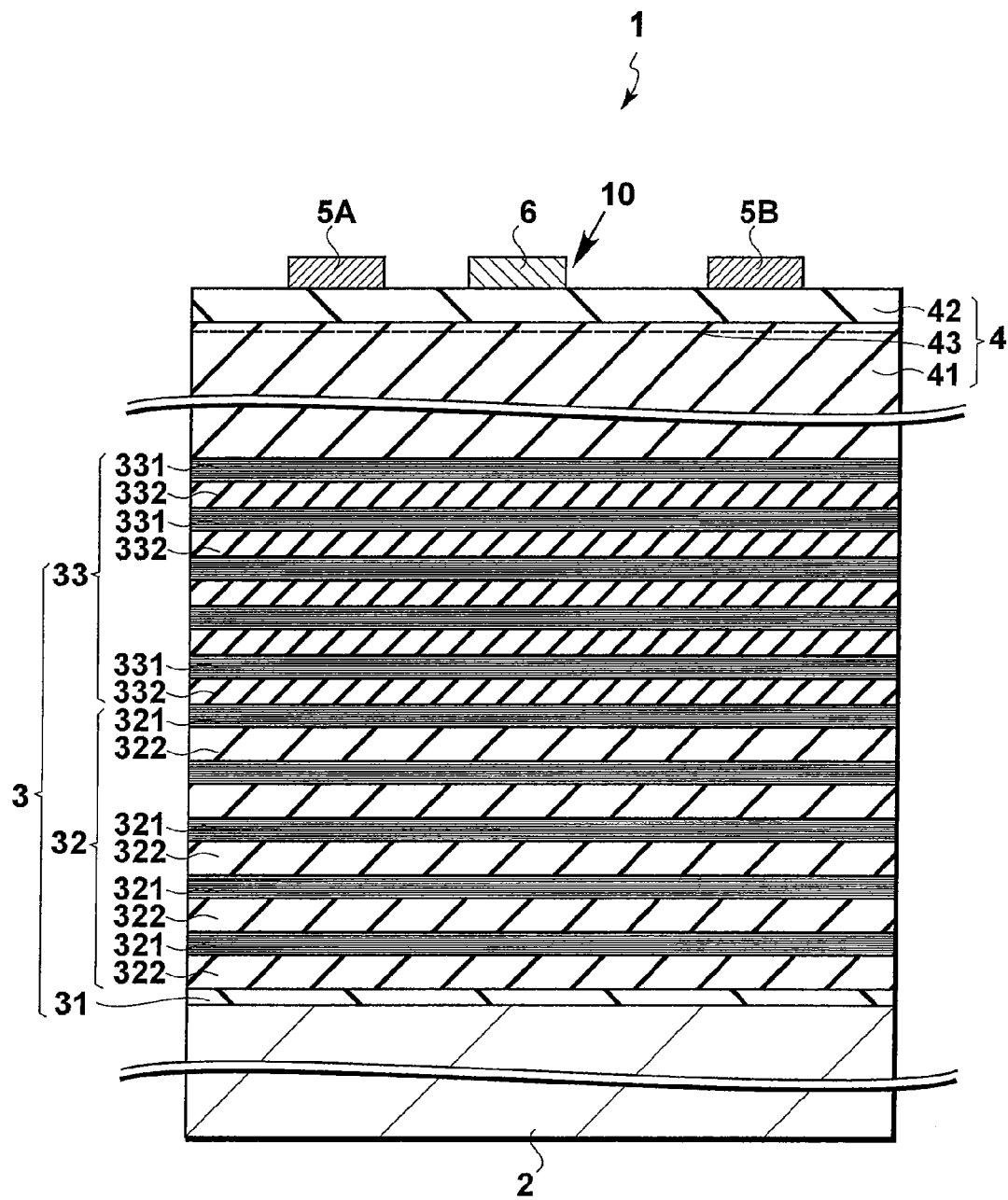
FIG. 1 is a schematic cross-sectional view illustrating a configuration of a main section of a semiconductor device according to Embodiment 1 of the present invention.

As illustrated in FIG. 1, a semiconductor device 1 according to Embodiment 1 includes a substrate 2, a buffer layer 3 provided on the substrate 2, and a nitride compound semiconductor layer (main semiconductor region) 4 provided on the buffer layer 3 and used as a device region. A HEMT 10 is provided in the nitride compound semiconductor layer 4.

In Embodiment 1, a silicon (Si) single-crystal semiconductor substrate is used as the substrate 2. The silicon single-crystal semiconductor substrate is more inexpensive than a sapphire substrate and the like for example. Silicon has a lattice constant of 0.543 nm and a thermal expansion coefficient of $2.6 \times 10^{-6}$ K$^{-1}$ ($2.55 \times 10^{-6}$ to $4.33 \times 10^{-6}$ K$^{-1}$).

The substrate 2 is not limited to the above example, and a silicon compound substrate such as a silicon carbide (SiC) substrate or a nitride compound semiconductor substrate such as a gallium nitride (GaN) substrate can be used.

The buffer layer 3 has a function to relax lattice mismatch between the substrate 2 and the nitride compound semiconductor layer 4. The buffer layer 3 includes a nitride compound semiconductor sublayer 31, a first multilayered buffer region 32, and a second multilayered buffer region 33. The nitride compound semiconductor sublayer 31 has aluminum (Al) composition provided on the substrate 2. The first multilayered buffer region 32 is provided on the nitride compound semiconductor sublayer 31 and formed by alternately laminating a plurality of first buffers 321 and second buffers 322. The second multilayered buffer region 33 is provided on the first multilayered buffer region 32 and formed by alternately laminating a plurality of first buffers 331 and second buffers 332.

For the nitride compound semiconductor sublayer 31 of the buffer layer 3, an AlN layer expressed by Equation (1) is used:

$$Al_xIn_yGa_{(1-x-y)}N \quad (1)$$

here, x>0, y>=0, and x+y<=1. The lattice constant of AlN is 0.3112 nm, and the thermal expansion coefficient is $4.15 \times 10^{-6}$ K$^{-1}$. The thickness of the nitride compound semiconductor sublayer 31 of the buffer layer 3 is set for example to 50 to 200 nm. Each of the layers in the buffer layer 3 is grown by an epitaxial growth method using Metal-Organic Vapor Phase Epitaxy (MOVPE) apparatus.

Figure 2A:
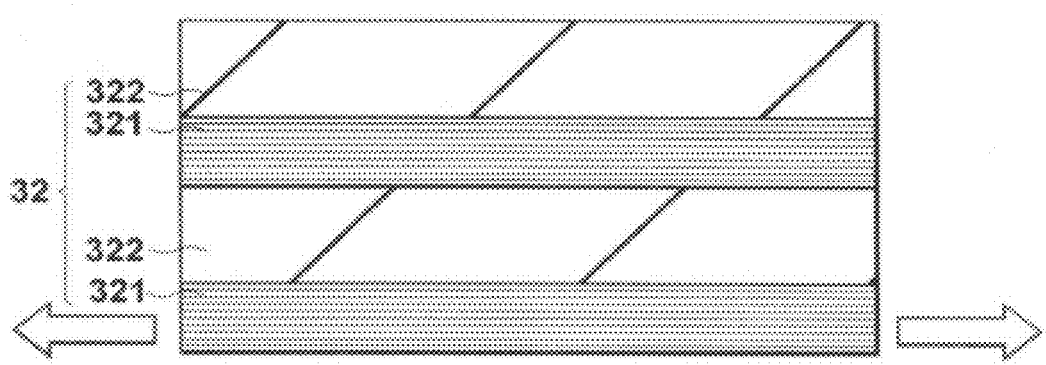
FIG. 2A is a schematic cross-sectional view illustrating a first multilayered buffer region of a buffer layer of the semiconductor device in FIG. 1 with a part thereof enlarged.

As illustrated in FIGS. 1 and 2A, in the first multilayered buffer region 32, each of the first buffers 321 is a superlattice buffer region of which a first nitride compound semiconductor layer and a second nitride compound semiconductor layer are alternately laminated. Here, the first nitride compound semiconductor layer has an Al composition and the second nitride compound semiconductor layer has a larger lattice constant than that of the first nitride compound semiconductor layer. For the first nitride compound semiconductor layer, the AlN layer expressed by Equation (1) is used. The thickness of each of the first nitride compound semiconductor layers of the first buffers 321 is set for example to 4 to 6 nm. For each of the second nitride compound semiconductor layers, a GaN layer expressed by Equation (2) is used:

$$Al_aIn_bGa_{(1-a-b)}N \quad (2)$$

here, x>a>=0, b>=0, and a+b<=1. The lattice constant of GaN is 0.3189 nm, and the thermal expansion coefficient is $5.59 \times 10^{-6}$ K$^{-1}$. The thickness of each of the second nitride compound semiconductor layers of the first buffers 321 is set for example to 2 to 4 nm.

Each of the first buffers 321 is formed by alternately laminating the first nitride compound semiconductor layer and the second nitride compound semiconductor layer. In Embodiment 1, the number of laminates is set to 5 to 15 for the first nitride compound semiconductor layer and the second nitride compound semiconductor layer, respectively, and the thickness of each of the first buffers 321 in the first multilayered buffer region 32 is set to 50 to 150 nm.

Each of the second buffers 322 is a single-layered buffer having a third nitride compound semiconductor layer of which the lattice constant is larger than that of each of the first buffers 321. For the third nitride compound semiconductor layer, a GaN layer expressed by Equation (3) is used:

$$Al_mIn_nGa_{(1-m-n)}N \quad (3)$$

here, a>=m>=0, n>=0, and m+n<=1. Each of the second buffers 322 is basically set to be thicker than each of the first buffers 321, which is 150 to 250 nm for example, and preferably 190 to 210 nm.

In the first multilayered buffer region 32, the first buffers 321 and the second buffers 322 are alternately laminated. In Example 1, the number of laminates is set to 5 for the first buffers 321 and the second buffers 322, respectively.

Figure 2B:
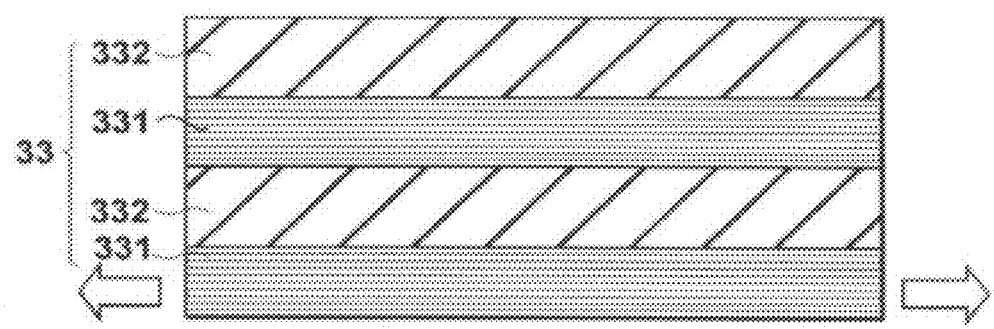
FIG. 2B is a schematic cross-sectional view illustrating a second multilayered buffer region of the buffer layer of the semiconductor device in FIG. 1 with a part thereof enlarged.

As illustrated in FIGS. 1 and 2B, similarly to the first buffers 321 of the first multilayered buffer region 32, each of the first buffers 331 of the second multilayered buffer region 33 is a superlattice buffer region of which a first nitride compound semiconductor layer and a second nitride compound semiconductor layer are alternately laminated. Here, the first nitride compound semiconductor layer has an Al composition and the second nitride compound semiconductor layer has a larger lattice constant than that of the first nitride compound semiconductor layer. For the first nitride compound semiconductor layer of the first buffers 331, an AlN layer expressed by Equation (1) is used. The thickness of each of the first nitride compound semiconductor layers of the first buffers 331 is set for example to 4 to 6 nm. For each of the second nitride compound semiconductor layers of the first buffers 331, a GaN layer expressed by Equation (2) is used. The thickness of each of the second nitride compound semiconductor layers of the first buffers 331 is set for example to 2 to 4 nm. In Embodiment 1, the number of laminates is set to 10 for the first nitride compound semiconductor layer and the second nitride compound semiconductor layer, respectively, in each of the first buffers 331, and the thickness of each of the first buffers 331 is set to 50 to 150 nm.

Each of the second buffers 332 of the second multilayered buffer region 33 is a single-layered buffer having a third nitride compound semiconductor layer of which the lattice constant is larger than that of the first buffers 331 of the second multilayered buffer region 33. For the third nitride compound semiconductor layer, a GaN layer expressed by Equation (3) is used. Each of the second buffers 332 of the second multilayered buffer region 33 is set for example to 150 to 200 nm thickness which is thicker than each of the first buffers 331 of the second multilayered buffer region 33 and also set to 160 to 180 nm thickness which is thinner than each of the second buffers 322 of the first multilayered buffer region 32.

In the second multilayered buffer region 33, the first buffers 331 and the second buffers 332 are alternately laminated. In Embodiment 1, the number of laminates is set to 5 for the first buffers 331 and the second buffers 332, respectively.

In the buffer layer 3, each of the second buffers 332 of the second multilayered buffer region 33 illustrated in FIG. 2B is set to be thinner than each of the second buffers 322 of the first multilayered buffer region 32 illustrated in FIG. 2A. That means, a pair of the first buffer 331 and the neighboring second buffer 332 of the second multilayered buffer region 33 has higher total Al composition than that of a pair of the first buffer 321 and the neighboring second buffer 322 of the first multilayered buffer region 32. In Embodiment 1, the pair of the first buffer 321 and the neighboring second buffer 322 of the first multilayered buffer region 32 (the first multilayered buffer region 32), which is on the substrate 2 side, has the total Al composition of 21 to 22%. On the other hand, the pair of the first buffer 331 and the neighboring second buffer 332 of the second multilayered buffer region 33 (the second multilayered buffer region 33), which is on the nitride compound semiconductor layer 4 side, has the total Al composition of 24 to 26%.

Each of the second buffer 322 of the first multilayered buffer regions 32 and the second buffer 332 of the second multilayered buffer region 33 is GaN layer in which shrinkage after growing in a fabrication process is greater than silicon of the substrate 2 and each of the first buffers 321 and 331. Thus, by setting the total Al composition of the pair of the first buffer 331 and the neighboring second buffer 332 of the second multilayered buffer region 33 high in the buffer layer 3 on the nitride compound semiconductor layer 4 side, compressive stress generated in the second buffers 332 of the second multilayered buffer region 33 becomes small and tensile stress generated in the first buffers 331 of the second multilayered buffer region 33 becomes small as well.

In order to grow the thicker nitride compound semiconductor layer 4 on the buffer layer 3 while suppressing cracks thereon, average Al composition is made higher for the effective growth considering stress balance between the respective layers. The tensile stress is generated in the nitride compound semiconductor in the cooling process after finishing the deposition based on a difference between the thermal expansion coefficient of the silicon (substrate 2) and the nitride compound semiconductor (buffer layer 3). When the tensile stress reaches yield condition, cracks occur on the nitride compound semiconductor. Here, if the average Al composition of the buffer layer 3 is set higher than that of the nitride compound semiconductor layer 4, the tensile stress is applied to the buffer layer 3 and the compressive stress is applied to the nitride compound semiconductor layer 4 due to the relation between the lattice constants of both layers. Adjustment of the stress balance thus secured reduces the tensile stress in the nitride compound semiconductor layer 4 and can suppress the cracks from occurring. On the other hand, the tensile stress in the buffer layer 3 increases. However, each of the first buffer 321 of the first multilayered buffer regions 32 and the first buffer 331 of the second multilayered buffer regions 33 has the multilayered structure of AlN layers and GaN layers (superlattice buffer region), which can reduce the stress therein and suppress the cracks from occurring. The stress relaxation by adopting the multilayered structure is achieved by introducing dislocation and by crystal defects occurring at a heterojunction interface. That is, as the average Al composition of the buffer layer 3 becomes higher, the tensile stress generated in the nitride compound semiconductor layer 4 can be reduced more. For this reason, the buffer layer 3 and the nitride compound semiconductor layer 4 can be respectively grown thick, while suppressing cracks from occurring in the nitride compound semiconductor layer 4.

In the buffer layer 3, the tensile stress occurs in each of the first buffers 321 of the first multilayered buffer region 32 due to the lattice constant difference with each of the second buffers 322, and similarly, the tensile stress occurs in each of the first buffers 331 of the second multilayered buffer region 33 due to the lattice constant difference with each of the second buffers 332. Elastic deformation occurs and warp is inherent in all the layers.

On the nitride compound semiconductor layer 4 side of the buffer layer 3, the second multilayered buffer region 33 is arranged. The thinner each of the second buffers 332 of the second multilayered buffer region 33 becomes, the smaller the tensile stress of each of the neighboring first buffer 331 becomes.

In the second multilayered buffer region 33, thinning of each of the second buffers 332 indicates that the total Al composition becomes higher for the pair of the first buffer 331 and the neighboring second buffer 332. Arranging the second multilayered buffer region 33 on the nitride compound semiconductor layer 4 side in the buffer layer 3 can suppress the cracks from occurring in the nitride compound semiconductor layer 4.

On the substrate 2 side in the buffer layer 3, the first multilayered buffer region 32 is arranged. By thickening each of the second buffers 322 of the first multilayered buffer region 32, the tensile stress applied to each of the neighboring buffers 321 becomes larger. Many crystal defects occur on the substrate side, increasing the stress relaxation effect.

Thickening of each of the second buffers 322 indicates that the total Al composition becomes lower for the pair of the first buffer 321 and the neighboring second buffer 322.

In the semiconductor device 1 according to Embodiment 1, the buffer layer 3 includes: the first multilayered buffer region 32 in which the total Al composition of each pair of the first buffer 321 and the second buffer 322 is uniform; and the second multilayered buffer region 33 in which the total Al composition of each pair of the first buffer 331 and the second buffer 332 is uniform. The Al composition is set to change in a step-by-step manner, so that the Al composition becomes larger by stages from the substrate 2 side to the nitride compound semiconductor layer 4 side. Here, the Al composition is changed step-by-step linearly. In other words, in the buffer layer 3, each of the second buffers 332 of the second multilayered buffer region 33 are changed to become thinner by stages with respect to each of the second buffers 322 of the first multilayered buffer region 32. As described in later embodiments, the change here is a two-step change, although the change is not limited to this number.

In Embodiment 1, the Al composition of each pair of the first buffer 321 and the second buffer 322 of the first multilayered buffer region 32 (the first multilayered buffer region 32) is uniform, and so is the Al composition of each pair of the first buffer 331 and the second buffer 332 of the second multilayered buffer region 33 on the first multilayered buffer region 32 (the second multilayered buffer region 33), and the Al composition is changed step-by-step linearly. However, the change is not limited to the above, and at least in the second multilayered buffer region 33, the Al composition can be made gradually small for every pair of the first buffer 331 and the second buffer 332 as the pairs get closer to the nitride compound semiconductor layer 4, thus the change is made in a curved manner. The curved change of the Al composition of the second multilayered buffer region 33 indicates that the thickness of each of the second buffers 332 of the second multilayered buffer region 33 changes in the curved manner.

As illustrated in FIG. 1, the nitride compound semiconductor layer 4 (compound semiconductor layer) includes a first semiconductor layer 41 arranged on the buffer layer 3, and a second semiconductor layer 42 arranged on the first semiconductor layer 41. The first semiconductor layer 41 is composed of a nitride compound semiconductor layer, or more specifically, an undoped GaN layer expressed by Equation (4):

$$Al_xIn_yGa_{(1-x-y)}N \quad (4)$$

here, $0<=x<=1$, $0<=y<=1$, and $0<=x+y<=1$. The thickness of the first semiconductor layer 41 is set to 3 μm, for example.

The first semiconductor layer 41 functions as a carrier transit layer. In Embodiment 1, electrons function as carriers in the HEMT 10, hence the first semiconductor layer 41 functions as an electron transit layer. The second semiconductor layer 42 is composed of the nitride compound semiconductor layer, specifically an undoped AlGaN layer which is expressed by Equation (4) and having a smaller lattice constant and a larger band gap than those of the first semiconductor layer 41. The second semiconductor layer 42 functions as a carrier supply layer, and as an electron supply layer in Embodiment 1.

Regarding the nitride compound semiconductor layer 4, in the vicinity of a heterojunction interface of the first semiconductor layer 41 and the second semiconductor layer 42 and on the first semiconductor layer 41, a two-dimensional carrier gas layer, specifically a two-dimensional electron gas (2DEG) layer is formed. The two-dimensional carrier gas layer 43 functions as a channel region through which a current (or either electrons or protons) flows in the HEMT 10.

As illustrated in FIG. 1, the HEMT 10 is provided on the nitride compound semiconductor layer 4, and includes the 2-dimensional carrier gas layer 43, a first main electrode (for example, a source electrode) 5A, a second main electrode (for example, a drain electrode) 5B, and a gate electrode 6.

In Embodiment 1, the first and second main electrodes 5A and 5B are respectively arranged on the second semiconductor layer 42. For the first and second main electrodes 5A and 5B, a laminate film can be used in which an aluminum (Al) layer is laminated on the titanium (Ti) layer.

The gate electrode 6 is arranged on the second semiconductor layer 42 with a Schottky contact, and positioned between the first main electrode 5A and second main electrode 5B. For the gate electrode 6, a nickel (Ni) layer can be used for example.

[Characteristics of Embodiment 1]

As described above, in the semiconductor device 1 according to Embodiment 1, the Al composition of the second multilayered buffer region 33 on the nitride compound semiconductor layer 4 side is set higher than that of the first multilayered buffer region 32 on the substrate 2 side. In other words, the buffers 332 of the second multilayered buffer region 33 on the nitride compound semiconductor layer 4 side are set thinner than the buffers 322 of the first multilayered buffer region 32 on the substrate 2 side.

By having the above configured buffer layer 3, the tensile stress applied to the buffer layer 3 on the substrate 2 side can be increased to suppress the warp of the substrate 2, and the tensile stress applied to the buffer layer 3 on the nitride compound semiconductor layer 4 side can be reduced to suppress the cracks from occurring on the nitride compound semiconductor layer 4. Accordingly, the buffer layer 3 and the nitride compound semiconductor layer 4 can respectively be made thick while suppressing the warp of the substrate 2 (a semiconductor wafer in a fabricating process), thereby improving the withstand voltage of the device.

[Modification 1]

Modification 1 of Embodiment 1 describes a semiconductor device 1A which is a modification of the buffer layer 3 of the semiconductor device 1 according to Embodiment 1.

Figure 3:
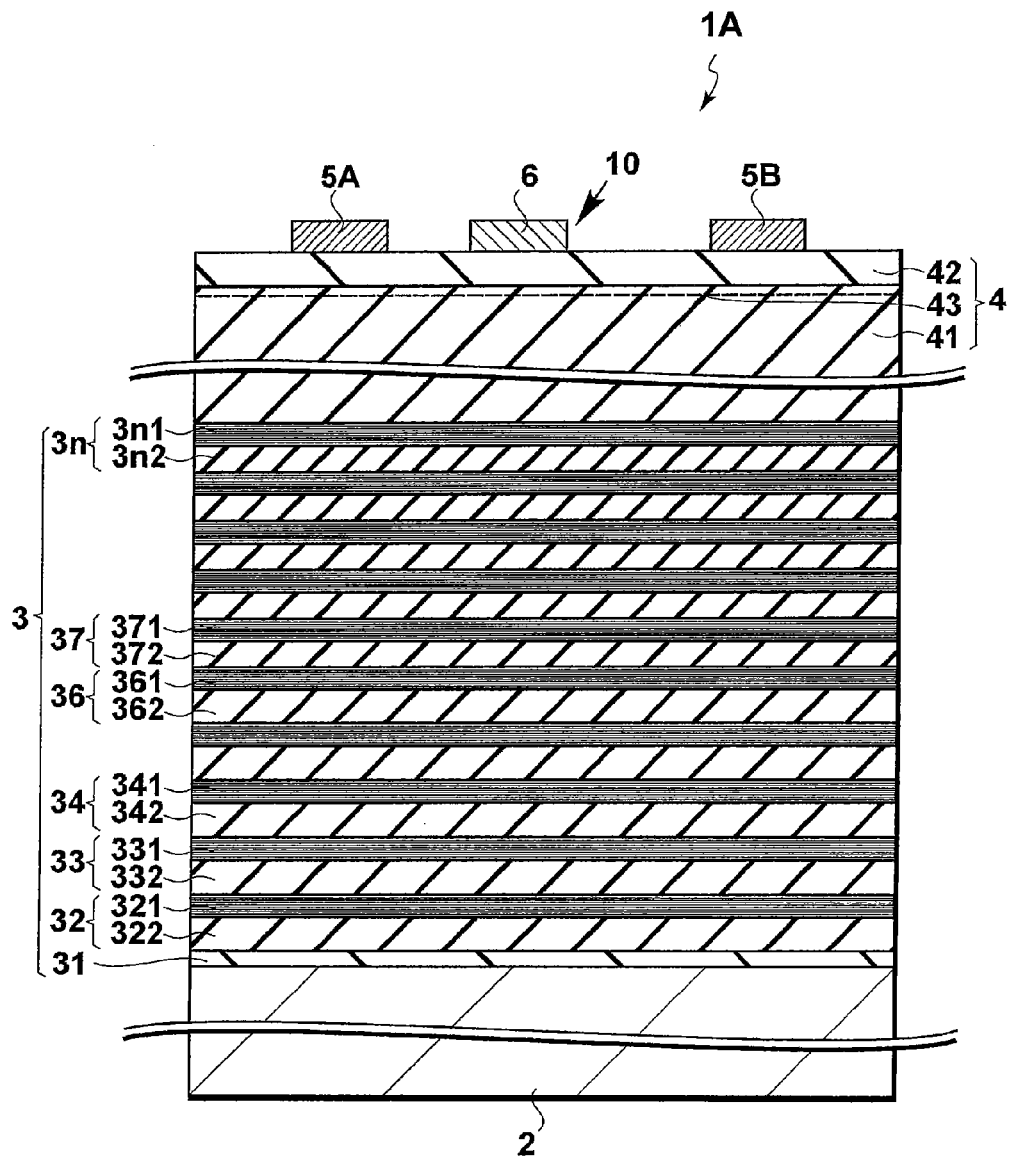
FIG. 3 is a schematic cross-sectional view illustrating a configuration of a main section of a semiconductor device according to Modification 1 of Embodiment 1.

As illustrated in FIG. 3, in the semiconductor device 1A according to Modification 1 of Embodiment 1, the buffer layer 3 includes three or more multilayered buffer regions 32 to 3n, from the substrate 2 towards the nitride compound semiconductor layer 4. The first multilayered buffer region 32 is formed by laminating the first buffer 321 and the second buffer 322, where the first buffer 321 is formed by alternately laminating the first nitride compound semiconductor (AlN) layers and the second nitride compound semiconductor (GaN) layers, and the second buffer 322 is composed by third nitride compound semiconductor (GaN) layer. Similarly, the second multilayered buffer region 33 is formed by laminating the first buffer 331 and the second buffer 332, where the first buffer 331 is formed by alternately laminating the first nitride compound semiconductor (AlN) layers and the second nitride compound semiconductor (GaN) layers, and the second buffer 332 is composed by the third nitride compound semiconductor (GaN) layer. Likewise, the (n−1)-th multilayered buffer region 3n is formed by laminating the first buffer 3n1 and the second buffer 3n2, where the first buffers 3n1 is formed by alternately laminating the first nitride compound semiconductor (AlN) layers and the second nitride compound semiconductor (GaN) layers, and the second buffer 3n2 is composed by the third nitride compound semiconductor (GaN) layer.

For example, referring to the above described semiconductor device 1 according to Embodiment 1, the thickness of the second buffer 322 of the first multilayered buffer region 32 is set to 200 nm. Then, the buffer thickness of each of the second buffers 332 to 3n2 is reduced step-by-step by 10 nm. That is, if ten layers of the multilayered buffer regions are provided, the second buffer 332 of the second multilayered buffer region 33 becomes 190 nm thickness, the second buffer 342 of the third multilayered buffer region 34 becomes 180 nm thickness, . . . and the second buffer 3n2 of the (n−1)-th (n−1=10) multilayered buffer region 3n becomes 110 nm thick. Similarly to the semiconductor device 1 according to Embodiment 1, in the semiconductor device 1A according to Modification 1 of Embodiment 1, the total Al composition becomes low for the pair of the first buffer 321 and the second buffer 322 of the first multilayered buffer region 32 of the buffer layer 3 on the substrate 2 side, and the total Al composition becomes high for the pair of the first buffer 3n1 and the second buffers 3n2 of the (n−1)-th multilayered buffer region 3n on the nitride compound semiconductor layer 4 side. Moreover, in the buffer layer 3, the second buffer 3n2 of the (n−1)-th multilayered buffer region 3n on the nitride compound semiconductor layer 4 side is thinner than the second buffer 322 of the first multilayered buffer region 32 on the substrate 2 side.

In the buffer layer 3, the Al composition increases gradually and linearly in step-by-step manner from the substrate 2 side towards the nitride compound semiconductor layer 4 side, and the thickness reduces gradually and linearly in step-by-step manner from the second buffer 322 to the second buffer 3n2.

Regarding the semiconductor device 1A according to Modification 1 of Embodiment 1, the Al composition and the thickness of the second buffers 322 to 3n2 may be changed for every multilayered buffer regions. For example, the Al composition is made equal for the first and second multilayered buffer regions 32 and 33, and equal for the fourth and fifth multilayered buffer regions 34 and 35, respectively, and the latter pair may have higher Al composition than the former pair. Likewise, the thickness of the second buffers 322 to 3n2 may be changed gradually.

By having the above configured semiconductor device 1A according to Modification 1 of Embodiment 1, the similar functional advantage can be obtained as in the semiconductor device 1 according to Modification 1 of Embodiment 1.

[Modification 2]

Modification 2 of Embodiment 1 describes a modification of the buffer layer 3 of the semiconductor device 1 according to Embodiment 1.

Figure 4A:
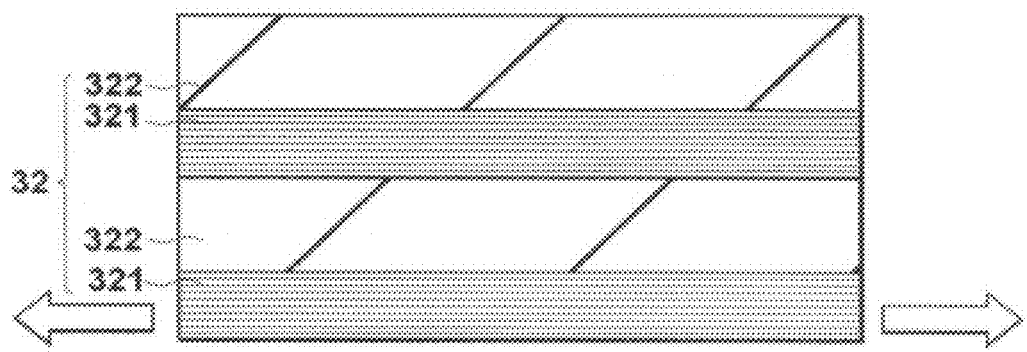
FIG. 4A is a schematic cross-sectional view illustrating a first multilayered buffer region of a buffer layer of a semiconductor device according to Modification 2 of Embodiment 1 with a part thereof enlarged.
Figure 4B:
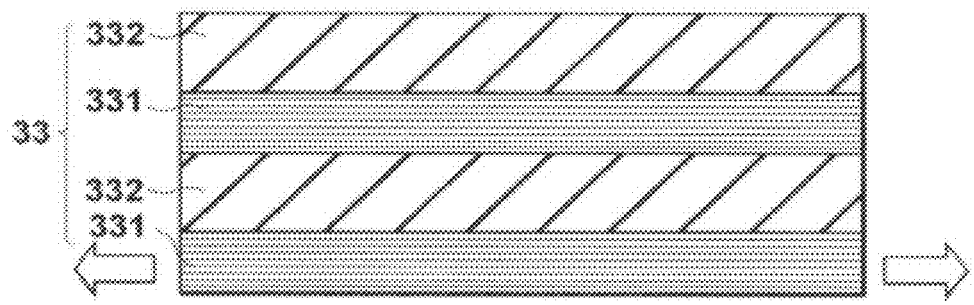
FIG. 4B is a schematic cross-sectional view illustrating a second multilayered buffer region of the buffer layer of the semiconductor device according to Modification 2 of Embodiment 1 a part thereof enlarged.

In Modification 2 of Embodiment 1, each of the first buffers 331 of the second multilayered buffer region 33 illustrated in FIG. 4B is set to be thinner than each of the first buffers 321 of the first multilayered buffer region 32 illustrated in FIG. 4A. That is, the thickness of each of the first buffers 321 of the first multilayered buffer region 32 do not necessarily be equal to the thickness of each of the first buffers 331 of the second multilayered buffer region 33. Here, each of the second buffers 332 of the second multilayered buffer region 33 is made thinner than each of the second buffers 322 of the first multilayered buffer region 32, so in the same manner, each of the first buffers 331 of the second multilayered buffer region 33 is made thinner than each of the first buffers 321 of the first multilayered buffer region 32. The first buffers 331 of the second multilayered buffer region 33 are made thin by reducing the number of laminates of the first nitride compound semiconductor (AlN) layers and the second nitride compound semiconductor (GaN) layers.

For example in the semiconductor device 1 according to Embodiment 1, the number of laminates is set to 10 for the respective first and second nitride compound semiconductor layers of each of the first buffers 331 of the second multilayered buffer region 33. The number is set to 9 in Modification 2 of Embodiment 1 for the respective first and second nitride compound semiconductor layers of each of the first buffers 331 of the second multilayered buffer region 33. In this case, in the buffer layer 3, the Al composition on the substrate 2 side is 21 to 22%, whereas the Al composition on the nitride compound semiconductor layer 4 side is 22.5 to 23.5%.

By having the above configuration, the similar functional advantage can be obtained in Modification 2 of Embodiment 1 as in Embodiment 1. Further, the configuration of Modification 2 of Embodiment 1 may be combined with Modification 1 of Embodiment 1.

[Modification 3]

Modification 3 of Embodiment 1 describes a semiconductor device 1C which is an example of a semiconductor device according to any one of Embodiment 1 and Modifications 1 and 2 of Embodiment 1, where the warp of the substrate 2 can be further suppressed.

As illustrated in FIG. 5, the semiconductor device 1C according to Modification 3 of Embodiment 1 further includes a warp regulation layer 30 for regulating the warp of the substrate 2, between the substrate 2 and the buffer layer 3. The warp regulation layer 30 is formed of an AlGaN layer or a composite film of an AlN layer and a GaN layer, for example, to act as a foundation of an epitaxial growth film of the buffer layer 3. The warp regulation layer 30 aims to regulate the warp of the substrate 2, and therefore the Al composition therein is not counted in the comparison of the Al composition of the buffer layer 3.

By having the above configured semiconductor device 1C according to Modification 3 of Embodiment 1, the similar functional advantage can be obtained as in any one of Embodiment 1 and Modifications 1 and 2 of Embodiment 1, and moreover, the warp can be further suppressed from occurring in the substrate 2 (semiconductor wafer).

(Embodiment 2)

Embodiment 2 of the present invention describes an example of applying the present invention in a semiconductor device provided with a light emitting diode (LED).

[Configuration of LED in the Semiconductor Device]

Figure 6:
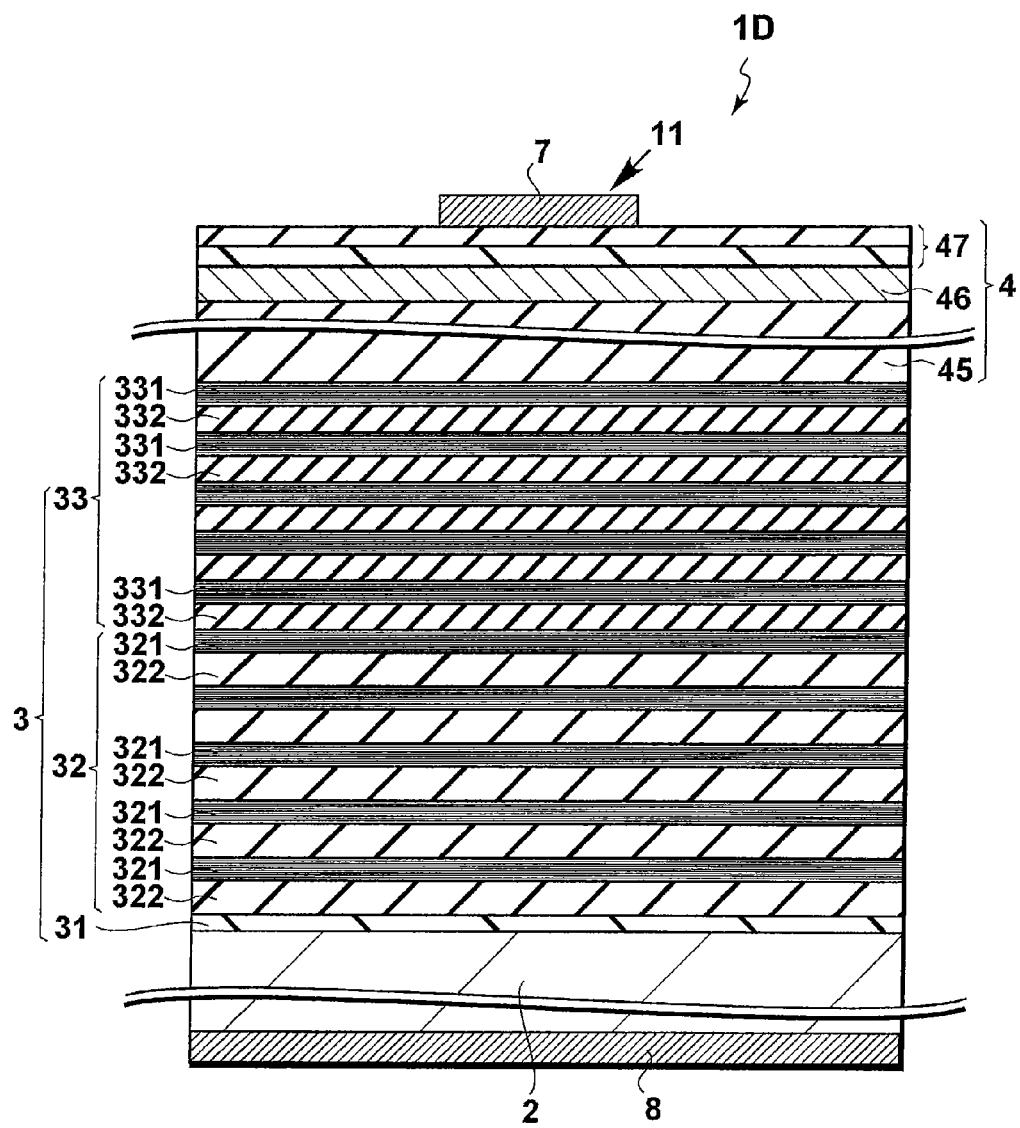
FIG. 6 is a schematic cross-sectional view illustrating a configuration of a main section of a semiconductor device according to Embodiment 2 of the present invention.

As illustrated in FIG. 6, a semiconductor device 1D according to Embodiment 2 includes the substrate 2, the buffer layer 3 provided on the substrate 2, and the nitride compound semiconductor layer (main semiconductor region) 4 provided on the buffer layer 3 and used as a device region. An LED 11 is provided on the nitride compound semiconductor layer 4. The LED 11 is used as a semiconductor light emitting device.

The respective configurations of the substrate 2 and the buffer layer 3 of the semiconductor device 1D according to Embodiment 2 is basically the same with the configurations of the substrate 2 and the buffer layer 3 of the semiconductor device 1 according to Embodiment 1.

The nitride compound semiconductor layer 4 includes an n-type cladding layer 45, an active layer 46, and a p-type cladding layer 47, sequentially arranged on the buffer layer 3 in this order. For the n-type cladding layer 45, a silicon-doped GaN layer is used for example. Thickness of the n-type cladding layer 45 is set to 1.8 to 2.2 $\mu$m. For the p-type cladding layer 47, a laminate of a magnesium-doped AlGaN layer and a magnesium-doped GaN layer is used for example. The LED 11 is configured by including the n-type cladding layer 45, the active layer 46, and the p-type cladding layer 47 of the nitride compound semiconductor layer 4.

An anode electrode (p-type electrode) 7 is arranged on the p-type cladding layer 47 of the nitride compound semiconductor layer 4, and a cathode electrode (n-type electrode) 8 is arranged on a rear surface of the substrate 2. Here, the cathode electrode 8 may be arranged on the surface of the n-type cladding layer 45 after boring a hole from the surface of the substrate 2 down to the n-type cladding layer 45.

[Characteristics of Embodiment 2]

As described above, in the semiconductor device 1D according to Embodiment 2, the similar functional advantage can be obtained as in the semiconductor device 1 according to Embodiment 1.

Moreover, in the semiconductor device 1D according to Embodiment 2, the respective buffer layers 3 according to Modifications 1 and 2 of Embodiment 1 can be used, and the warp regulation layer 30 according to Modification 3 of Embodiment 1 can be used as well.

(Other Embodiments)

As described above, the description is described using some embodiments, however, the discussion and the drawings constituting a part of the disclosure do not limit the present invention. The present invention can be applied to various alternative embodiments, examples and operation techniques.

For example, the buffer layer 3, which is used in the above described semiconductor device according to Embodiments 1 and 2, can also be used when configuring a Schottky barrier diode (SBD) on the nitride compound semiconductor layer 4. Further, in the semiconductor device according to Embodiments 1 and 2, an example of using the nitride compound semiconductor layer 4 with the thickness of 1 µm or more is described; however, the above described buffer layer 3 can be used with the nitride compound semiconductor layer 4 with the thickness of 1 µm or less.

What is claimed is:

1. A semiconductor device comprising:
   a substrate;
   a buffer layer arranged on the substrate; and
   a compound semiconductor layer which is arranged on the buffer layer and functions as a device region, wherein
   the buffer layer is configured by laminating two or more pairs of a first buffer and a second buffer,
   the first buffer is formed by laminating one or more pairs of a first nitride compound semiconductor layer and a second nitride compound semiconductor layer, the first nitride compound semiconductor layer having an aluminum composition therein, the second nitride compound semiconductor layer having a larger lattice constant than that of the first nitride compound semiconductor layer,
   the second buffer includes a third nitride compound semiconductor layer having a larger lattice constant than that of the first buffer, and
   a total Al composition of a pair of the first buffer and the second buffer on a compound semiconductor layer side is higher than that of a pair of the first buffer and the second buffer on a substrate side.

2. The semiconductor device according to claim 1, wherein a thickness of the second buffer on the compound semiconductor layer side is set to be thinner than that of the second buffer on the substrate side.

3. The semiconductor device according to claim 2, wherein a thickness of each second buffer is set to become gradually thinner from the substrate side towards the compound semiconductor layer side.

4. The semiconductor device according to claim 1, wherein in each of the pairs of the first buffer and the second buffer, the second buffer is set to be thicker than the first buffer.

5. The semiconductor device according to claim 1, wherein each first buffer is set to 50 to 150 nm thickness, and each second buffer is set to 100 to 400 nm thickness.

6. The semiconductor device according to claim 1, wherein the total Al composition of each pair of the first buffer and the second buffer is set to become gradually higher from the substrate side towards the compound semiconductor layer side.

7. The semiconductor device according to claim 1, wherein for the substrate, any one of a silicon substrate, a silicon compound substrate, and a nitride compound semiconductor substrate is used.

* * * * *